(12) United States Patent
Chan et al.

(10) Patent No.: US 11,521,958 B2
(45) Date of Patent: Dec. 6, 2022

(54) SEMICONDUCTOR DEVICE PACKAGE WITH CONDUCTIVE PILLARS AND REINFORCING AND ENCAPSULATING LAYERS

(71) Applicant: Advanced Semiconductor Engineering, Inc., Kaohsiung (TW)

(72) Inventors: Ya Fang Chan, Kaohsiung (TW); Yuan-Feng Chiang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 3 days.

(21) Appl. No.: 16/675,011

(22) Filed: Nov. 5, 2019

(65) Prior Publication Data

US 2021/0134781 A1    May 6, 2021

(51) Int. Cl.
| | | |
|---|---|---|
| H01L 25/065 | (2006.01) | |
| H01L 25/00 | (2006.01) | |
| H01L 21/768 | (2006.01) | |
| H01L 23/00 | (2006.01) | |
| H01L 23/31 | (2006.01) | |
| H01L 27/108 | (2006.01) | |
| H01L 29/66 | (2006.01) | |
| H01L 21/285 | (2006.01) | |
| H01L 21/311 | (2006.01) | |
| H01L 21/3213 | (2006.01) | |
| H01L 23/528 | (2006.01) | |

(Continued)

(52) U.S. Cl.
CPC ............ *H01L 25/50* (2013.01); *H01L 21/486* (2013.01); *H01L 21/563* (2013.01); *H01L 21/76224* (2013.01); *H01L 23/3128* (2013.01); *H01L 23/49833* (2013.01); *H01L 23/49861* (2013.01); *H01L 24/05* (2013.01); *H01L 24/13* (2013.01); *H01L 2224/02333* (2013.01)

(58) Field of Classification Search
CPC . H01L 25/50; H01L 23/49894; H01L 21/486; H01L 21/563; H01L 21/76224; H01L 23/3128; H01L 23/49833; H01L 23/49861; H01L 24/05; H01L 24/13; H01L 2224/02333; H01L 2224/2101; H01L 2224/24155; H01L 21/4871; H01L 24/03; H01L 24/04; H01L 2224/0233; H01L 2224/02331; H01L 23/5226; H01L 2224/02379; H01L 2224/02381
See application file for complete search history.

(56) References Cited

U.S. PATENT DOCUMENTS 9,425,156 B2 *   8/2016   Jung ................... H01L 23/5384
9,653,391 B1 *   5/2017   Yew .................... H01L 23/5389
(Continued)

FOREIGN PATENT DOCUMENTS

KR        101901713        * 9/2018

*Primary Examiner* — Nicholas J Tobergte
*Assistant Examiner* — Tenley H Schofield
(74) *Attorney, Agent, or Firm* — Foley & Lardner LLP

(57) ABSTRACT

A semiconductor device package includes a redistribution layer, a plurality of conductive pillars, a reinforcing layer and an encapsulant. The conductive pillars are in direct contact with the first redistribution layer. The reinforcing layer surrounds a lateral surface of the conductive pillars. The encapsulant encapsulates the first redistribution layer and the reinforcing layer. The conductive pillars are separated from each other by the reinforcing layer.

6 Claims, 21 Drawing Sheets

(51) Int. Cl.
*H01L 29/51* (2006.01)
*H01L 21/3115* (2006.01)
*H01L 21/265* (2006.01)
*H01L 21/28* (2006.01)
*H01L 21/02* (2006.01)
*H01L 21/3065* (2006.01)
*H01L 23/498* (2006.01)
*H01L 21/762* (2006.01)
*H01L 21/56* (2006.01)
*H01L 21/48* (2006.01)

(56) References Cited

U.S. PATENT DOCUMENTS

| | | | |
|---|---|---|---|
| 10,319,607 B2 | 6/2019 | Wu et al. | |
| 10,453,785 B2 * | 10/2019 | Shim | H01L 21/56 |
| 2004/0004291 A1 * | 1/2004 | Hirose | H01L 25/0652 |
| | | | 257/777 |
| 2008/0116569 A1 * | 5/2008 | Huang | H01L 24/24 |
| | | | 257/E23.101 |
| 2008/0230901 A1 * | 9/2008 | Duchesne | H05K 3/3436 |
| | | | 257/738 |
| 2014/0070396 A1 * | 3/2014 | Kyozuka | H01L 24/19 |
| | | | 257/698 |
| 2014/0077364 A1 * | 3/2014 | Marimuthu | H01L 23/5389 |
| | | | 257/737 |
| 2014/0360765 A1 * | 12/2014 | Kiwanami | H05K 1/185 |
| | | | 174/260 |
| 2016/0118333 A1 * | 4/2016 | Lin | H01L 23/528 |
| | | | 257/773 |
| 2017/0033062 A1 * | 2/2017 | Liu | H01L 21/486 |
| 2017/0033082 A1 * | 2/2017 | Lin | H01L 23/49838 |
| 2018/0138127 A1 * | 5/2018 | Lee | H01L 23/3114 |
| 2019/0006283 A1 * | 1/2019 | Wang | H01L 21/76834 |
| 2019/0189550 A1 * | 6/2019 | Kim | H05K 1/185 |
| 2019/0189561 A1 * | 6/2019 | Rusli | H01L 24/73 |
| 2019/0189564 A1 * | 6/2019 | Guzek | H01L 21/56 |
| 2019/0378795 A1 * | 12/2019 | Lee | H01L 24/92 |
| 2020/0006220 A1 * | 1/2020 | Pan | H01L 23/3128 |
| 2020/0098693 A1 * | 3/2020 | Jeng | H01L 21/76885 |
| 2020/0303216 A1 * | 9/2020 | Kurose | H01L 21/4814 |

\* cited by examiner

SEMICONDUCTOR DEVICE PACKAGE WITH CONDUCTIVE PILLARS AND REINFORCING AND ENCAPSULATING LAYERS

BACKGROUND

1. Technical Field

The present disclosure relates to a semiconductor device package, and more particularly, to a package structure with a plurality of conductive pillars.

2. Description of Related Art

In Fan-Out Package-on-Package technology of three-dimensional integrated circuits, through-silicon vias or copper pillars are usually used as electrical channels for the stacked packages. However, manufacturing through-silicon vias or copper pillars is costly. Further, the height of the copper pillars may be different from each other due to the manufacturing process and the height difference may be up to 30 μm or more. Therefore, there may be a short failure between the stacked packages.

SUMMARY

In some embodiments, a semiconductor device package includes a first redistribution layer, a plurality of conductive pillars, a reinforcing layer and an encapsulant. The first redistribution layer has a first surface and the conductive pillars are in direct contact with the first surface of the first redistribution layer. The reinforcing layer surrounds a lateral surface of the conductive pillars. The encapsulant encapsulates the reinforcing layer and in contact with the first surface of the first redistribution layer. The conductive pillars are separated from each other by the reinforcing layer.

In some embodiments, a semiconductor device package includes an electrical connection member, a first electronic component, an encapsulant and a first redistribution layer. The electrical connection member includes a reinforcing layer and a plurality of conductive pillars passing through the reinforcing layer. The encapsulant encapsulates the first electronic component and the electrical connection member. The first redistribution layer is disposed on a top surface of the encapsulant and electrically connected to at least one of the conductive pillars. A bottom surface of the conductive pillars is coplanar with a bottom surface of the reinforcing layer and a bottom surface of the encapsulant.

In some embodiments, a method of manufacturing a semiconductor device package includes preparing an electrical connection member. The electrical connection member is prepared by the following steps: providing a first carrier, wherein a first conductive layer is disposed on a surface of the first carrier, forming a plurality of first conductive pillars on the first conductive layer, providing a dielectric material on the first conductive layer, wherein the dielectric material fills among the first conductive pillars; and removing the first carrier.

Figure 1:
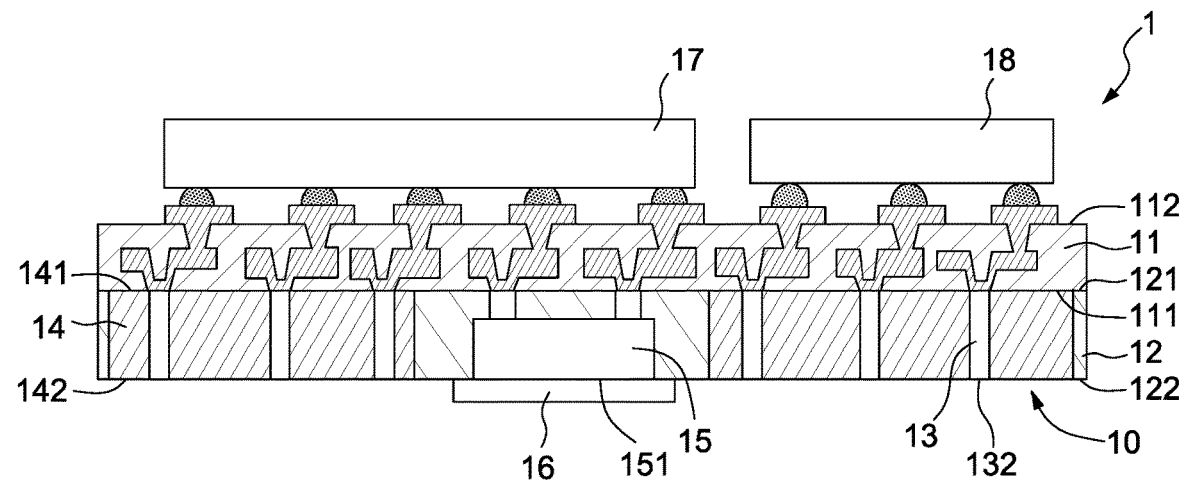
FIG. 1 illustrates a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION OF THE PREFERRED EMBODIMENTS

The aforementioned illustrations and following detailed descriptions are by example for the purpose of further explaining the scope of the present disclosure. Other objectives and advantages related to the present disclosure will be illustrated in the subsequent descriptions and appended drawings.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

The present disclosure describes techniques for the manufacture of a semiconductor device package without the use of through-silicon vias (TSV) as electrical channels. In some embodiments according to the present disclosure, an electrical connection member including a plurality of conductive pillars is preformed and to be used as electrical channels. The conductive pillars are covered by a reinforcing layer so that the potential displacement of conductive pillars during a step of applying molding compound can be avoided. In addition, in some embodiments according to the present disclosure, the height of the conductive pillars can be controlled by grinding the electrical connection member so that a short failure due to the height difference of conductive pillars or TSV in comparative embodiments can be avoided.

FIG. 1 illustrates a cross-sectional view of a semiconductor device package 1 in accordance with some embodiments of the present disclosure. The semiconductor device package 1 may include an electrical connection member 10, a redistribution layer 11, an encapsulant 12, a first electronic component 15, a second electronic component 17 and a third electronic component 18.

The electrical connection member 10 may include a plurality of conductive pillars 13 and a reinforcing layer 14. The conductive pillars 13 may include, for example, copper or other metal, or metal alloy, or other conductive material. In some examples, the conductive pillars 13 are copper pillars. The reinforcing layer 14 may be a dielectric layer. The reinforcing layer 14 may be made of solder resist, Ajinomoto build-up film (ABF), or other dielectric material. In some embodiment, the reinforcing layer 14 is made of a dielectric material (e.g., ABF) having a lower coefficient of thermal expansion (CTE), for example, 30 ppm/° C. or below, 25 ppm/° C. or below, 20 ppm/° C. or below, 18 ppm/° C. or below, or 15 ppm/° C. or below, and the warpage of the semiconductor device package 1 can be reduced. In some embodiment, the conductive pillars 13 are copper pillars, the reinforcing layer 14 is made of ABF, and the semiconductor device package 1 has a reduced warpage. The reinforcing layer 14 surrounds a lateral surface of each conductive pillar 13, and the conductive pillars 13 are separated from each other by the reinforcing layer 14. In some embodiments as illustrated in FIG. 1, the reinforcing layer 14 fully covers the lateral surface of the conductive pillars 13. Thus, a thickness of the reinforcing layer 14 is substantially identical to a height of the conductive pillars 13. Further, the conductive pillars 13 may pass through the reinforcing layer 14, and may be exposed from a first surface 142 of the reinforcing layer 14, wherein the first surface 142 of the reinforcing layer 14 is substantially flat and faces away the redistribution layer 11.

The redistribution layer 11 is disposed on the reinforcing layer 14 of the electronic member 10 and electrically connects the conductive pillars 13. As shown in FIG. 1, a second surface 141 of the reinforcing layer 14 may be attached to and in contact with a first surface 111 of the redistribution layer 11 and the conductive pillars 13 are in direct contact with the first surface 111 of the redistribution layer 11.

The encapsulant 12 may surround or encapsulate a lateral surface of the reinforcing layer 14 of the electrical connection member 10 and the first electronic component 15. The encapsulant 12 may be in contact with the first surface 111 of the redistribution layer 11. The encapsulant 12 may include, for example, a Novolac-based resin, an epoxy-based resin, a silicone-based resin, or other another suitable encapsulant. Suitable fillers may also be included, such as powdered $SiO_2$. In some embodiments, the reinforcing layer 14 may contain fillers and the fillers in the reinforcing layer 14 may be smaller than fillers of the encapsulant 12. Referring to FIG. 1, the encapsulant 12 may have a first surface 121, which is attached to the first surface 111 of the redistribution layer 11, and a second surface 122, which is opposite the first surface 121 and substantially coplanar with the first surface 142 of the reinforcing layer 14 of the electrical connection member 10. The surface 132 of the conductive pillars 13 exposed from the first surface 142 of the reinforcing layer 14 may be coplanar with the second surface 122 of the encapsulant 12 as well.

The first electronic component 15 may be a die or a chip and having an active surface facing the redistribution layer 11. In some embodiments, the electrical connection member 10 (or two or more electrical connection member 10) defines a cavity for accommodating the first electronic component 15. In other words, the first electronic component 15 is accommodated within the cavity defined by the electrical connection member(s) (e.g., the reinforcing layer 14 of the electrical connection member(s)) and the encapsulant 12 fills within the cavity and covers the first electronic component 15. The first electronic component 15 may be electrically connected to the redistribution layer 11. The first electronic component 15 may have a back surface 151 (e.g., a passive surface) which faces away the redistribution layer 11 and is coplanar with the second surface 141 of the reinforcing layer 14. In some embodiments, an additional layer 16, such as a heat dissipation layer or a metal layer, may be attached to the surface 151 of the first electronic component 15.

In some embodiments, the semiconductor device package may further include one or more electronic components, such as DRAM(s) or capacitor(s), mounted on a second surface 112 of the redistribution layer 11. In some embodiments as illustrated in FIG. 1, the semiconductor device package further includes a second electronic component 17 and a third electronic component and 18 are mounted on a second surface 112 of the redistribution layer 11, which is opposite the first surface 111 of the redistribution layer 11.

Figure 2:
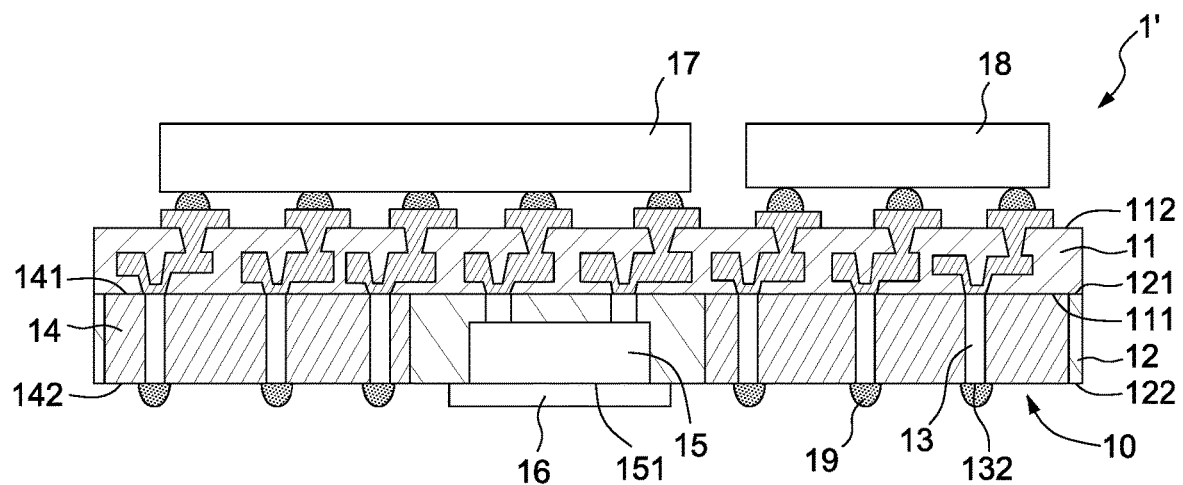
FIG. 2 illustrates a cross-sectional view of a semiconductor device package in accordance with some embodiments of the present disclosure.

FIG. 2 illustrates a cross-sectional view of a semiconductor device package 1' in accordance with some embodiments of the present disclosure. The semiconductor device package 1' shown in FIG. 2 is similar in certain respects to the semiconductor device package 1 shown in FIG. 1, except that in FIG. 2, a plurality of solder balls 19 are disposed on the first surface 142 of the reinforcing layer 14 of the electrical connection member 10 and electrically connected to the conductive pillars 13. Thus, in at least some embodiments, the semiconductor device package 1' further includes a plurality of solder balls 19 disposed on the first surface 142 of the reinforcing layer 14 of the electrical connection member 10 and electrically connected to the conductive pillars 13.

Figure 3:
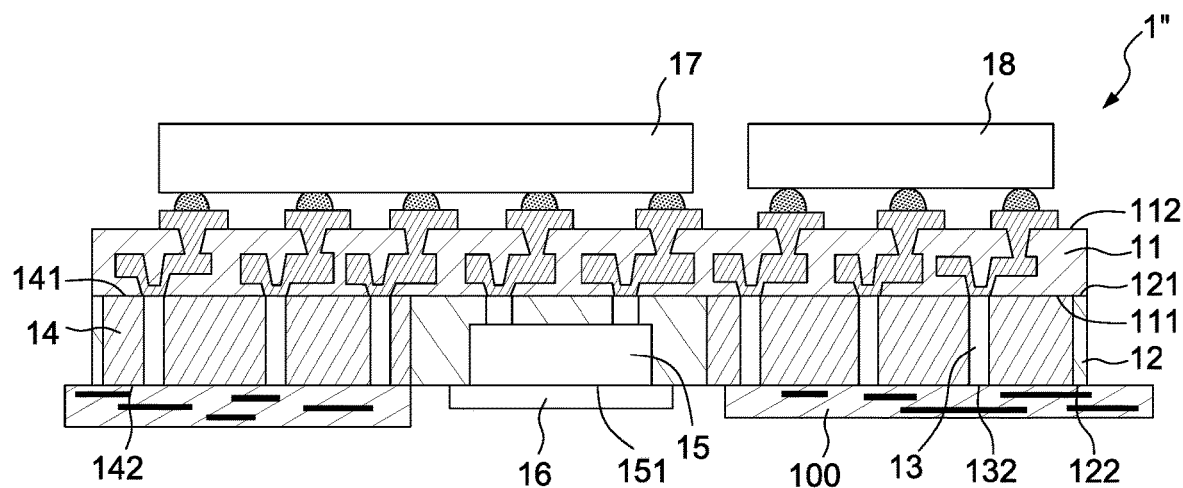
FIG. 3 illustrates a cross-sectional view of a semiconductor device package in accordance with some embodiments of the present disclosure.

FIG. 3 illustrates a cross-sectional view of a semiconductor device package 1" in accordance with some embodiments of the present disclosure. The semiconductor device package 1" shown in FIG. 3 is similar in certain respects to the semiconductor device package 1 shown in FIG. 1, except that in FIG. 3, an additional redistribution layer 100 is disposed on the first surface 142 of the reinforcing layer 14 of the electrical connection member 10 and electrically connected to the conductive pillars 13. Thus, in at least some embodiments, the semiconductor device package 1" further includes a redistribution layer 100 disposed on the first surface 142 of the reinforcing layer 14 of the electrical connection member 20 and electrically connected to the conductive pillars 13.

Figure 4:
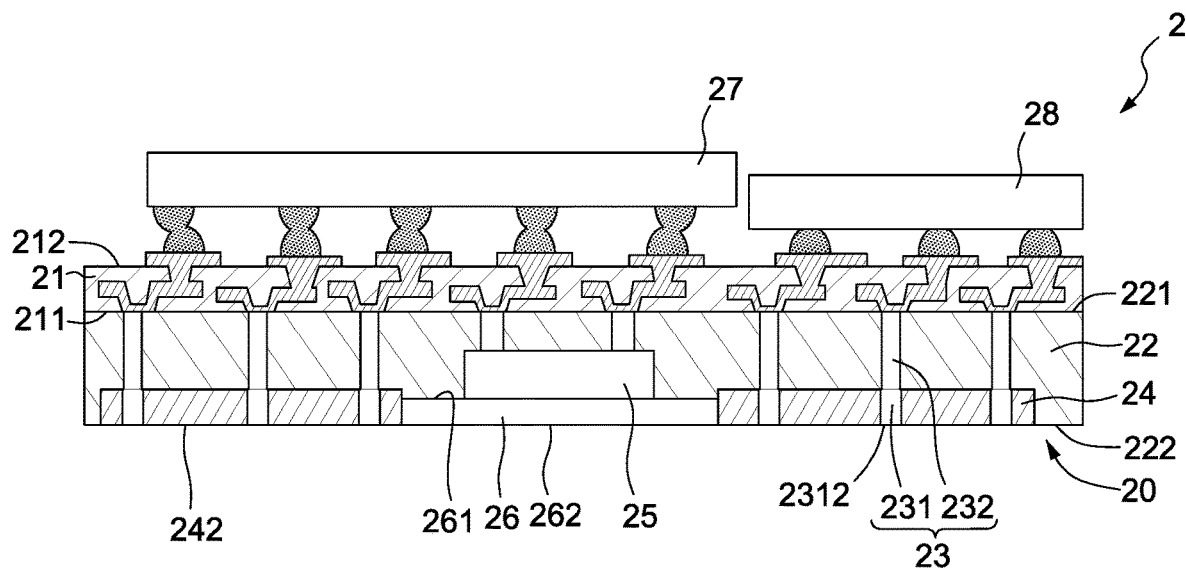
FIG. 4 illustrates a cross-sectional view of a semiconductor device package in accordance with some embodiments of the present disclosure.

FIG. 4 illustrates a cross-sectional view of a semiconductor device package 2 in accordance with some embodiments of the present disclosure. The semiconductor device package 2 may include an electrical connection member 20, a redistribution layer 21, an encapsulant 22, a first electronic component 25, a second electronic component 27 and a third electronic component 28.

The electrical connection member 20 may include a plurality of conductive pillars 23 and a reinforcing layer 24.

The conductive pillars 23 may include, for example, copper or other metal, or metal alloy, or other conductive material. In some examples, the conductive pillars 23 are copper pillars. The reinforcing layer 24 may be a dielectric layer. The reinforcing layer 24 may be made of solder resist or ABF, or other dielectric material. Similar to those discussed above for the semiconductor device package 1 of FIG. 1, in some embodiment, the reinforcing layer 24 may be made of a dielectric material having a lower CTE, and the warpage of the semiconductor device package 2 can be reduced. In some embodiment, the conductive pillars 23 are copper pillars and the reinforcing layer 24 is made of ABF, and the semiconductor device package 2 has a reduced warpage. The conductive pillar 23 may include a first pillar portion 231 and a second pillar portion 232. A diameter of the first pillar portion 231 may be substantially the same as or different from a diameter of the second pillar portion 232. In some embodiments, the diameter of the first pillar portion 231 is greater than the diameter of the second pillar portion 232. The reinforcing layer 24 surrounds a lateral surface of each first pillar portion 231, and the first pillar portions 231 are separated from each other by the reinforcing layer 24. Further, the first pillar portions 231 may pass through the reinforcing layer 24 and may be exposed from a first surface 242 of the reinforcing layer 24 of the electronic member 20, wherein the first surface 242 of the reinforcing layer 24 is substantially flat and faces away the redistribution layer 21. In addition, the second pillar portions 232 are in direct contact with the first pillar portions 231 and not covered by the reinforcing layer 24.

The redistribution layer 21 is disposed on the electronic member 20 and electrically connects the conductive pillars 23. As shown in FIG. 4, the second pillar portions 231 are attached to and in contact with a first surface 211 of the redistribution layer 21. That is, the conductive pillars 23 of the electronic member 20 are in direct contact with the first surface 211 of the redistribution layer 21.

The encapsulant 22 may surround or encapsulate a lateral surface of the reinforcing layer 24 and the lateral surface of the second pillar portions 232 of the electrical connection member 20 and the first electronic component 25. The encapsulant 12 may include, for example, a Novolac-based resin, an epoxy-based resin, a silicone-based resin, or other another suitable encapsulant. Suitable fillers may also be included, such as powdered $SiO_2$. In some embodiments, the reinforcing layer 24 may contain fillers and the fillers in the reinforcing layer 24 may be smaller than fillers of the encapsulant 22. Referring to FIG. 4, the encapsulant 22 may have a first surface 221, which is attached to the first surface 211 of the redistribution layer 21, and a second surface 222, which is opposite the surface 21 and substantially coplanar with the first surface 242 of the reinforcing layer 24 of the electrical connection member 20. That is, the surfaces 2312 of the first pillar portions 231 may be coplanar with the second surface 222 of the encapsulant 22 as well.

The first electronic component 25 may be a die or a chip and having an active surface facing the redistribution layer 21. In some embodiments, the electrical connection member 20 (or two or more electrical connection member 20) defines a cavity for accommodating the first electronic component 25. In other words, the first electronic component 25 is accommodated within the cavity defined by the electrical connection member(s) (e.g., the reinforcing layer 24 of the electrical connection member(s)) and the encapsulant 22 fills within the cavity and covers the first electronic component 25. The first electronic component 25 may be electrically connected to the redistribution layer 21.

The first electronic component 25 may have a back surface (e.g., a passive surface) opposite to the active surface of the electronic component 25. In some embodiments, similar to those illustrated in FIG. 1, the back surface of the first electronic component 25 may be coplanar with the first surface 242 of the reinforcing layer 24. In other embodiments as illustrated in FIG. 2, the back surface of the first electronic component 25 may be higher than the first surface 242 of the reinforcing layer 24 and an additional layer 26, such as a heat dissipation layer or a metal layer, may be attached to the back surface of the first electronic component 25. The layer 26 has a first surface 261 and a second surface 262 opposite to the first surface 261. The first surface 261 of the layer 26 is in contact with the back surface of the first electronic component 25. The second surface 262 of the layer 26 faces away the redistribution layer 21 and may be substantially coplanar with the first surface 242 of the reinforcing layer 24 of the electrical connection member 20. The layer 26 may be extended laterally to contact the electrical connection member 20.

The second and third electronic components 27 and 28, which may be DRAM(s) and/or capacitor(s), are mounted on a second surface 212 of the redistribution layer 21, which is opposite to the first surface 211 of the redistribution layer 21.

Figure 5:
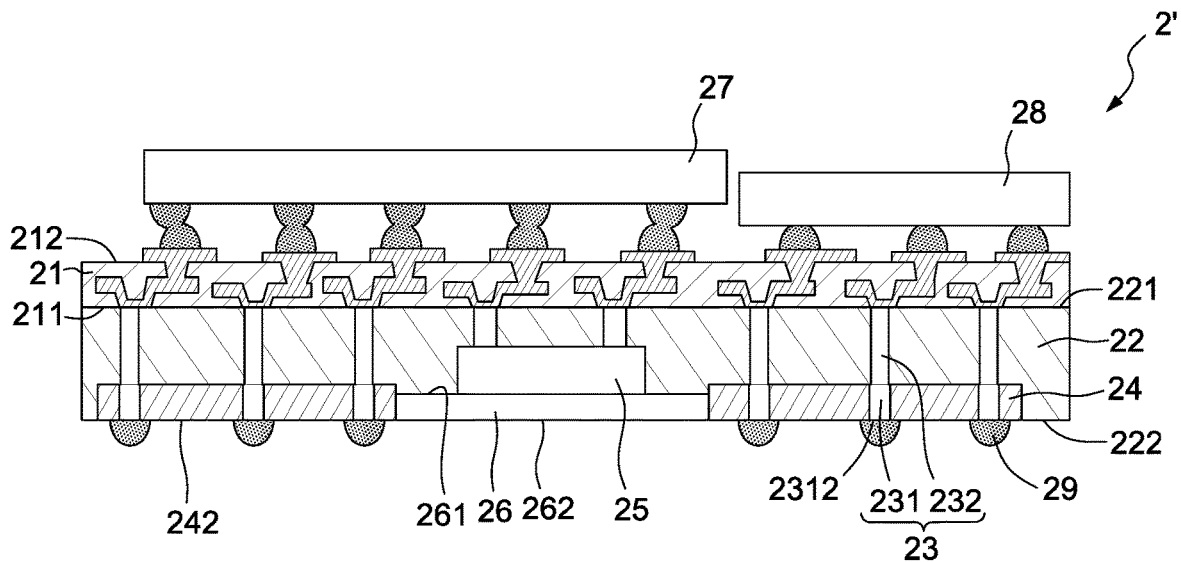
FIG. 5 illustrates a cross-sectional view of a semiconductor device package in accordance with some embodiments of the present disclosure.

FIG. 5 illustrates a cross-sectional view of a semiconductor device package 2' in accordance with some embodiments of the present disclosure. The semiconductor device package 2' shown in FIG. 5 is similar in certain respects to the semiconductor device package 2 shown in FIG. 4, except that in FIG. 5, a plurality of solder balls 29 are disposed on the first surface 242 of the reinforcing layer 24 of the electrical connection member 20 and electrically connected to the first pillar portions 231 of the conductive pillars 23. Thus, in at least some embodiments, the semiconductor device package 2' further includes a plurality of solder balls 29 disposed on the first surface 242 of the reinforcing layer 24 of the electrical connection member 20 and electrically connected to the conductive pillars 23.

Figure 6:
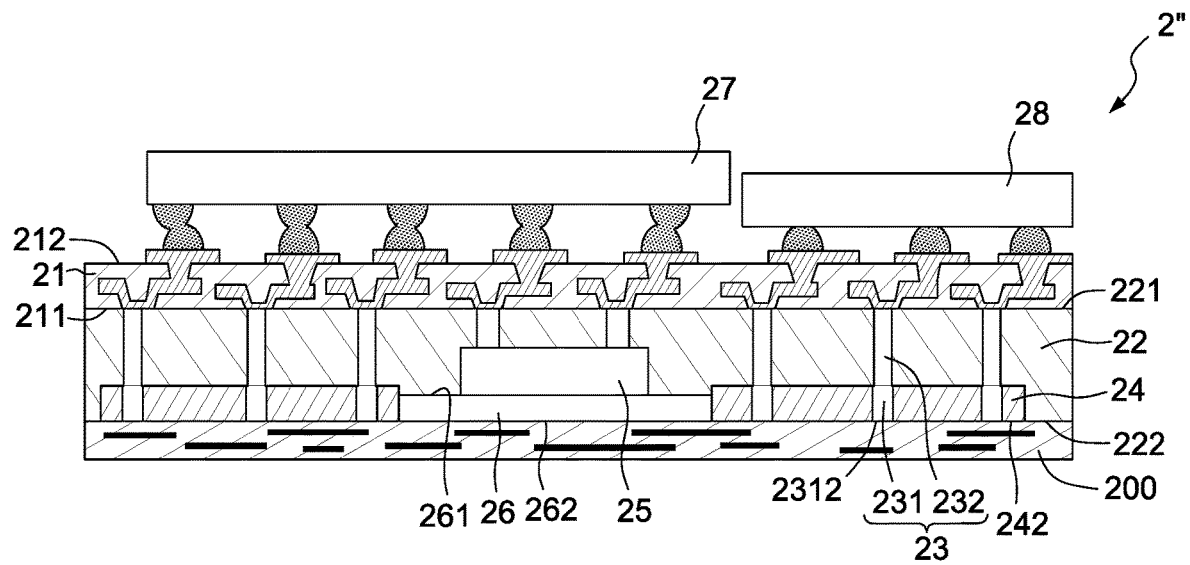
FIG. 6 illustrates a cross-sectional view of a semiconductor device package in accordance with some embodiments of the present disclosure.

FIG. 6 illustrates a cross-sectional view of a semiconductor device package 2" in accordance with some embodiments of the present disclosure. The semiconductor device package 2" shown in FIG. 6 is similar in certain respects to the semiconductor device package 2 shown in FIG. 4, except that in FIG. 6, an additional redistribution layer 200 is disposed on the first surface 242 of the reinforcing layer 24 of the electrical connection member 20 and electrically connected to the first pillar portions 231 of the conductive pillars 23. Thus, in at least some embodiments, the semiconductor device package 2" further includes a redistribution layer 200 disposed on the first surface 242 of the reinforcing layer 24 of the electrical connection member 20 and electrically connected to the conductive pillars 23.

FIGS. 7A, 7B, 7C, 7D, 7E and 7F illustrate one or more stages of a method of manufacturing an electrical connection member in accordance with some embodiments of the present disclosure.

Figure 7A:
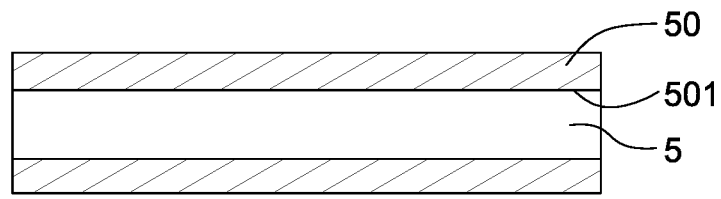
FIG. 7A, FIG. 7B, FIG. 7C, FIG. 7D, FIG. 7E and FIG. 7F illustrate one or more stages of a method of manufacturing an electrical connection member in accordance with some embodiments of the present disclosure.

In FIG. 7A, a carrier 5 (e.g., prepreg) is provided. The carrier 5 has a conductive layer 50 disposed on a first surface 501 of the carrier and may have a conductive layer (not denoted) disposed on the opposite surface. The conductive layer 50 is a metal layer, which includes copper or other metal, or metal alloy, or other conductive material.

Figure 7B:
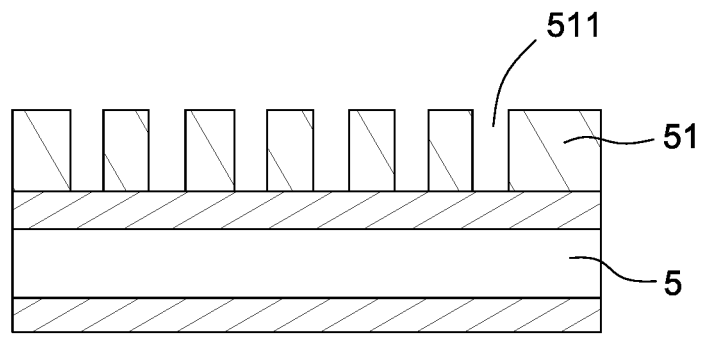

As shown in FIG. 7B, a photoresist layer 51 is formed on the conductive layer 50 of the carrier 5. The photoresist layer 51 includes through holes 511.

Figure 7C:
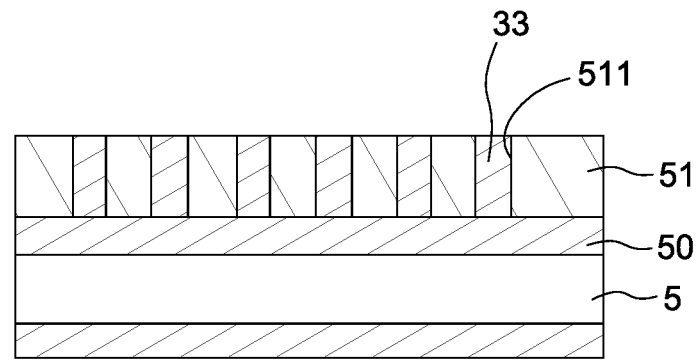

As shown in FIG. 7C, conductive pillars 33 are formed in the through holes 511 of the photoresist layer 51. The conductive pillars 33 may be made of copper or other metal, or metal alloy, or other conductive material. The conductive pillars 33 may be integrated with the conductive layer 50.

Figure 7D:
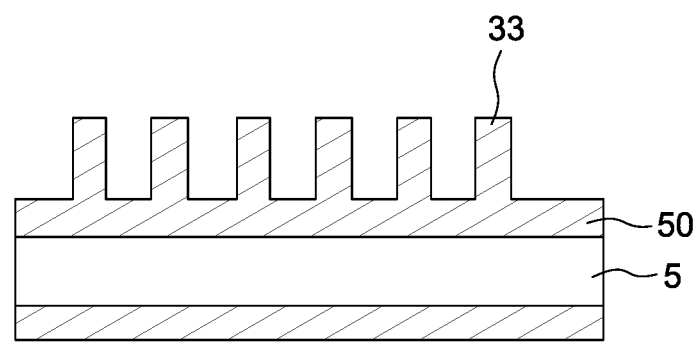

As shown in FIG. 7D, the photoresist layer 51 is removed from the carrier 5.

Figure 7E:
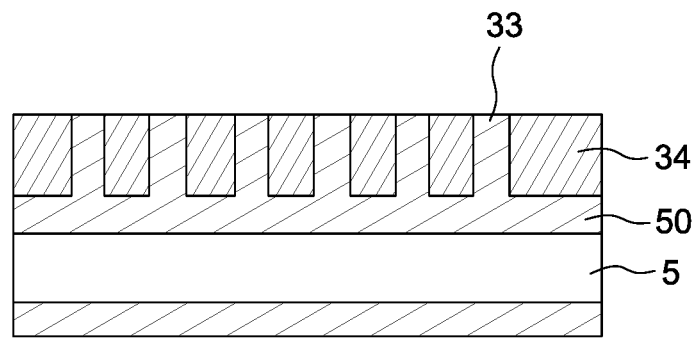

As shown in FIG. 7E, a reinforcing layer 34 is formed on the conductive layer 50 to surround the conductive pillars 33 by using a dielectric material. The dielectric material may be solder resist. The dielectric material fills among the conductive pillars 33, and thus the resulting reinforcing layer 34 surrounds a lateral surface of each conductive pillar 33 and the conductive pillars 13 are separated from each other by the reinforcing layer 34. Further, the reinforcing layer 34 also covers the conductive layer 50.

Figure 7F:
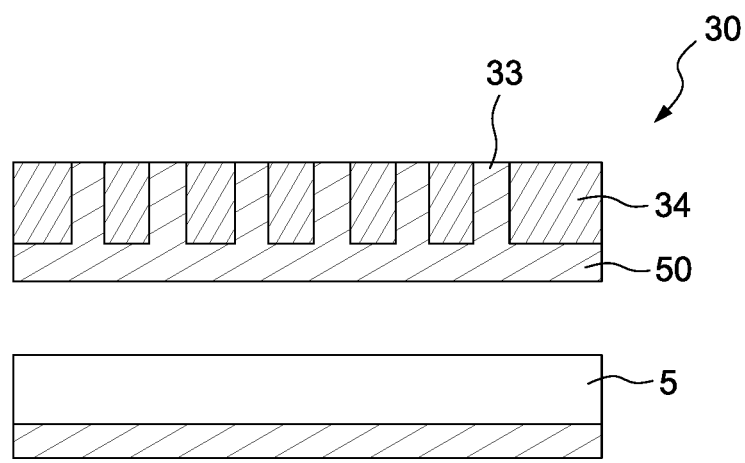

As shown in FIG. 7F, the carrier 5 is removed. After removing the carrier 5, an electrical connection member 30 including a plurality of conductive pillars 33 and a reinforcing layer 34 surrounding the lateral surface of the conductive pillars 33 is formed and attached on the conductive layer 50.

FIGS. 8A, 8B, 8C, 8D, 8E, 8F, 8G, 8H, 8I and 8J illustrate one or more stages of a method of manufacturing an electrical connection member 40 in accordance with some embodiments of the present disclosure.

Figure 8A:
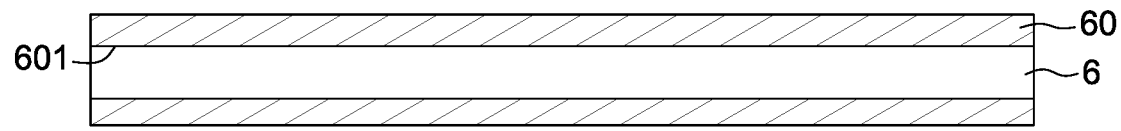
FIG. 8A, FIG. 8B, FIG. 8C, FIG. 8D, FIG. 8E, FIG. 8F, FIG. 8G, FIG. 8H, FIG. 8I and FIG. 8J illustrate one or more stages of a method of manufacturing an electrical connection member in accordance with some embodiments of the present disclosure.

In FIG. 8A, a carrier 6 (e.g., prepreg) is provided. The carrier 6 has a conductive layer 60 disposed on a first surface 601 of the carrier and may have a conductive layer (not denoted) disposed on the opposite surface. The conductive layer 60 is a metal layer, which includes copper or other metal, or metal alloy, or other conductive material.

Figure 8B:
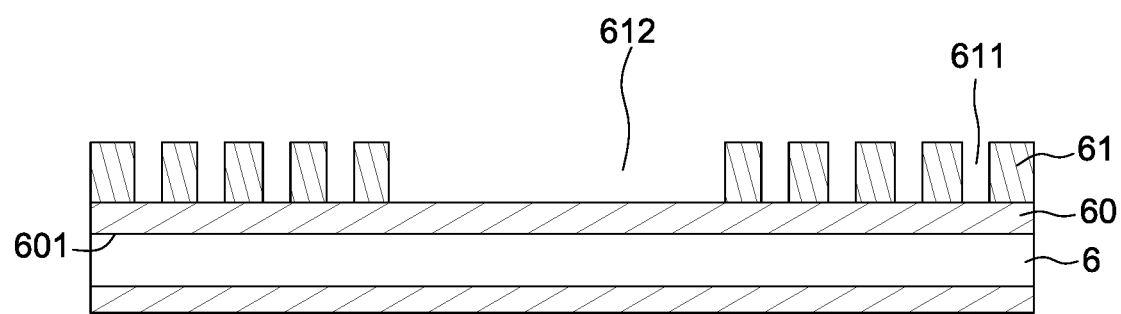

As shown in FIG. 8B, a first photoresist layer 61 is formed on the conductive layer 60 of the carrier 6. The first photoresist layer 61 includes through holes 611 and a cavity 612.

Figure 8C:
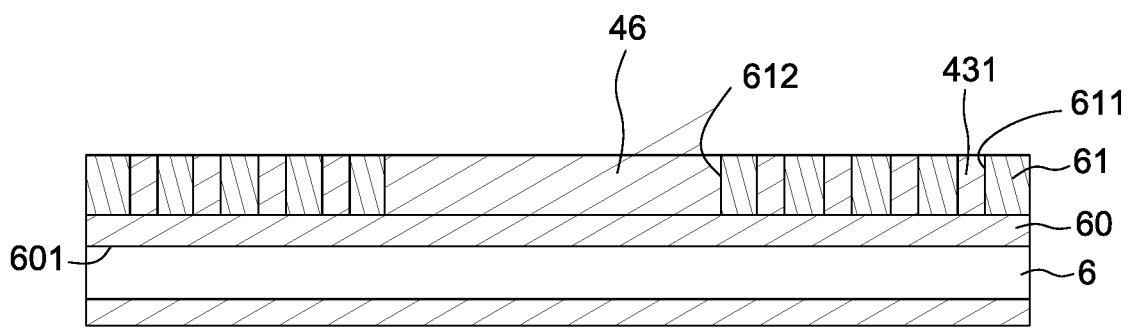

As shown in FIG. 8C, first pillar portions 431 are formed in the through holes 611 of the first photoresist layer 61 and a further conductive layer 46 is formed in the cavity 612 of the first photoresist layer 61. The first pillar portions 431 and the further conductive layer 46 may be made of the same of different material, including copper or other metal, or metal alloy, or other conductive material. The first pillar portions 431 may be integrated with the conductive layer 60. Moreover, the further conductive layer 46 may be integrated with the conductive layer 60 as well.

Figure 8D:
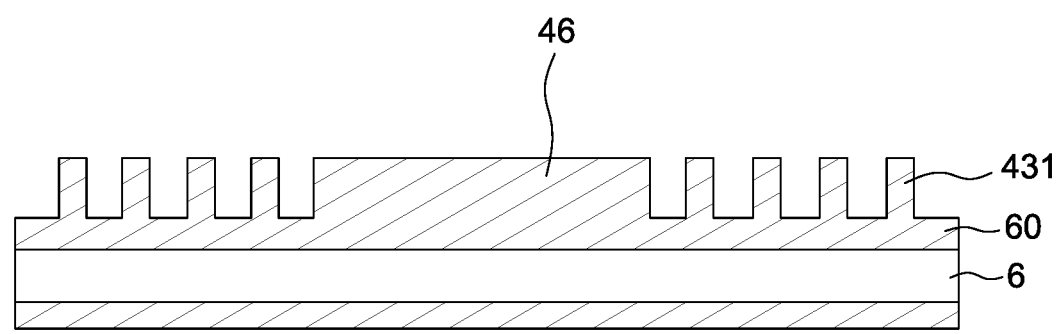

As shown in FIG. 8D, the first photoresist layer 61 is removed from the carrier 6.

Figure 8E:
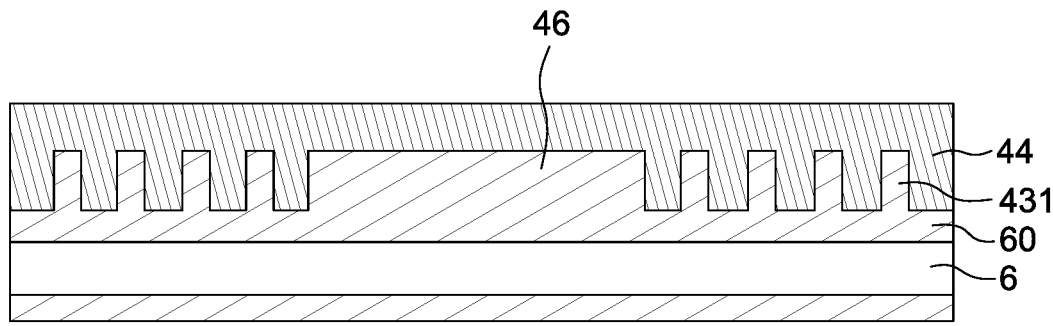

As shown in FIG. 8E, a reinforcing layer 44 is formed on the conductive layer 60 to encapsulate the first pillar portions 431 by using a dielectric material. The dielectric material may be ABF. The dielectric material fills among the first pillar portions 431 and thus the resulting reinforcing layer 44 surrounds a lateral surface of each first pillar portion 431 and the first pillar portions 431 are separated from each other by the reinforcing layer 44. The reinforcing layer 43 also surrounds a lateral surface or the periphery of the conductive layer 46. The reinforcing layer 44 covers the conductive layer 60. In addition, the reinforcing layer 44 may cover the top of the first pillar portions 431 and the top of the conductive layer 46.

Figure 8F:
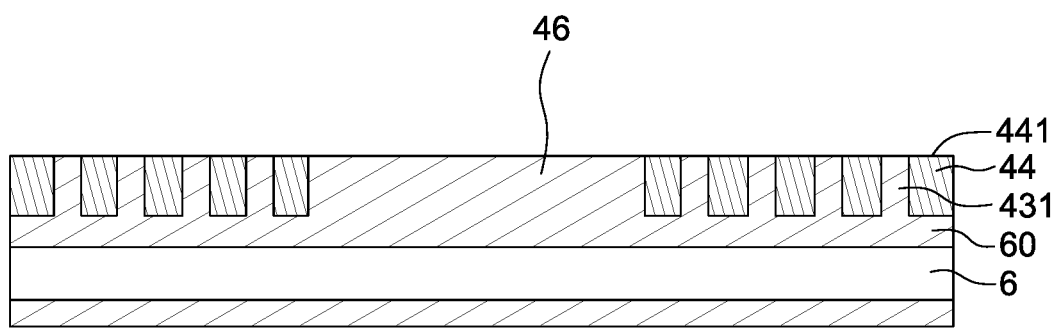

As shown in FIG. 8F, a portion of the reinforcing layer 44 is removed, e.g., by grinding, such that the first pillar portions 431 and the conductive layer 46 can be exposed from the surface 441 of the reinforcing layer 44. The first pillar portions 431 and the conductive layer 46 may be ground together with the reinforcing layer 44 simultaneously. In some embodiment, the top of the first pillar portions 431, the top of the conductive layer 46 and the top of reinforcing layer 44 are coplanar after grinding.

Figure 8G:
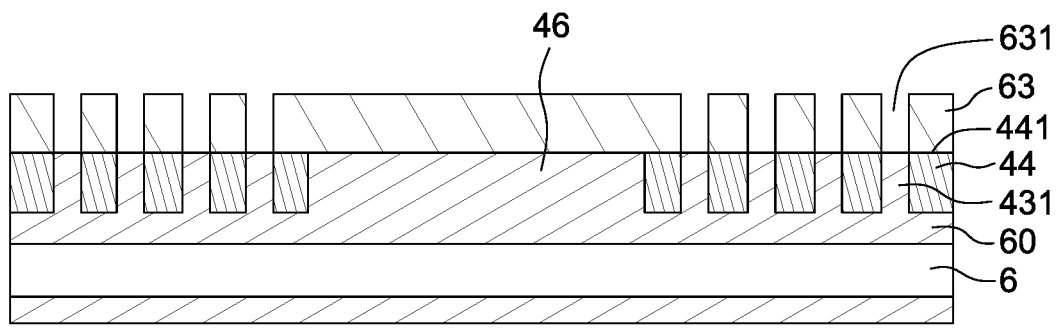

As shown in FIG. 8G, a second photoresist layer 63 is formed on the reinforcing layer 44 and the conductive layer 46 The second photoresist layer 63 includes a plurality of through holes 631 each of which are aligned with a respective one of the first pillar portions 431. A diameter of the through hole 631 may be the same as or different from a diameter of a respective first pillar portion 431. In some embodiments, the diameter of the through hole 631 may be smaller than the diameter of a respective first pillar portion 431.

Figure 8H:
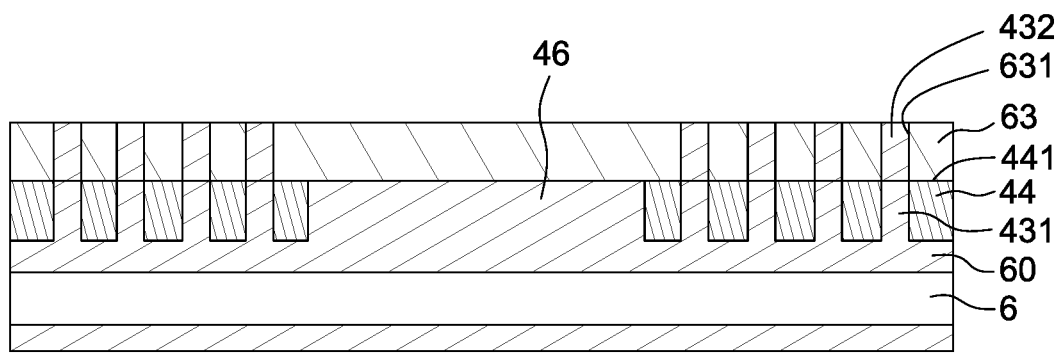

As shown in FIG. 8H, second pillar portions 432 are formed in the through holes 631 of the second photoresist layer 63. The resulting second conductive pillars 33 has a shape defined by the through holes 631. The second pillar portions 432 may be made of copper or other metal, or metal alloy, or other conductive material. The conductive pillars 33 may be integrated with the first pillar portion 431.

Figure 8I:
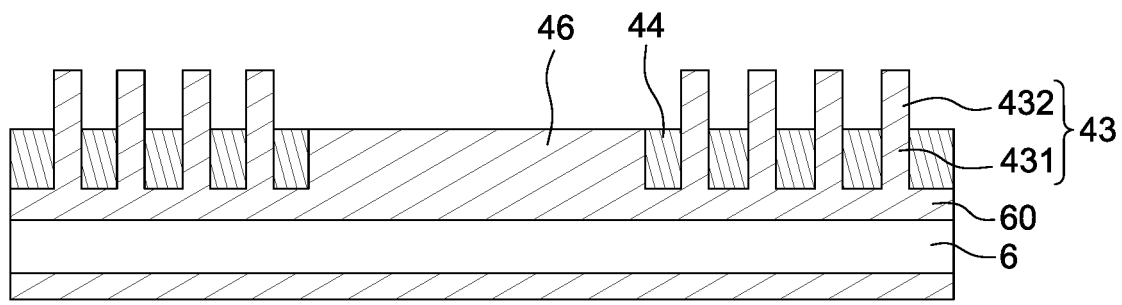

As shown in FIG. 8I, the second photoresist layer 63 is removed. In addition, since the first pillar portion 431 and the second pillar portion 432 are formed at the different stages, there may be an interface between the first pillar portion 431 and the second pillar portion 432.

Figure 8J:
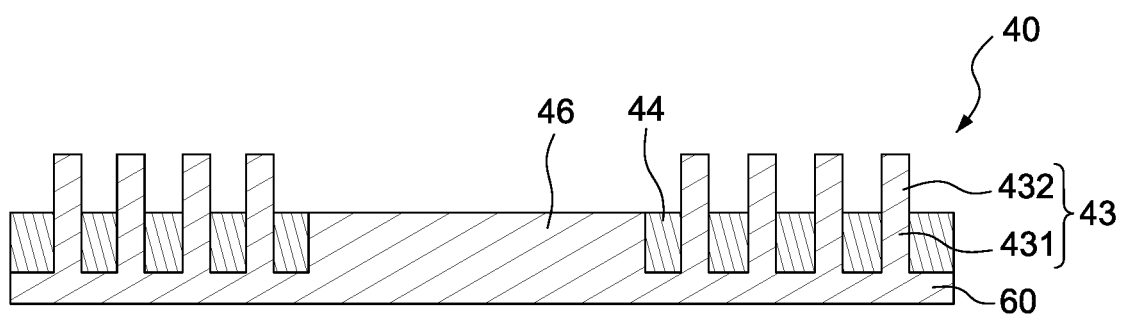

As shown in FIG. 8J, the carrier 6 is removed. After removing the carrier 6, an electrical connection member including a plurality of conductive pillars 43 a reinforcing layer 44 and a conductive layer 46 is formed and attached on the conductive layer 60. Each conductive pillar 43 includes a first pillar portion 431 and a second pillar portion 432. The reinforcing layer 44 surrounds the lateral surface of the first pillar portion 431 and the lateral surface (or periphery) of the conductive layer 46.

FIGS. 9A, 9B, 9C, 9D, 9E, 9F, 9G, 9H, 9I and 9J illustrate one or more stages of a method of manufacturing a semiconductor package in accordance with some embodiments of the present disclosure.

Figure 9A:
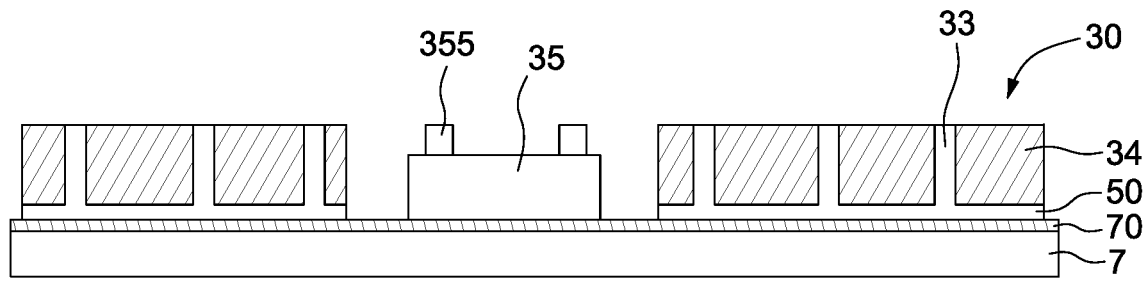
FIG. 9A, FIG. 9B, FIG. 9C, FIG. 9D, FIG. 9E, FIG. 9F, FIG. 9G, FIG. 9H, FIG. 9I and FIG. 9J illustrate one or more stages of a method of manufacturing a semiconductor device package in accordance with some embodiments of the present disclosure.

Referring to FIG. 9A, a carrier 7 having a conductive layer 70 on a top surface of the carrier is provided. The electrical connection members 30 prepared in accordance with the method illustrated in FIGS. 7A, 7B, 7C, 7D, 7E and 7F and a chip 35 are arranged on the conductive layer 70 of the carrier 7 as showed in FIG. 9A. The conductive layer 50 integrated with the electrical connection members 30 are attached to the conductive layer 70 of the carrier 7. The chip 35 has an active surface and a back surface opposite to the active surface. An electrical contact 355 is disposed on the active surface of the chip 35. The back surface of the chip 35 is attached on the conductive layer 70 of the carrier 7.

Figure 9B:
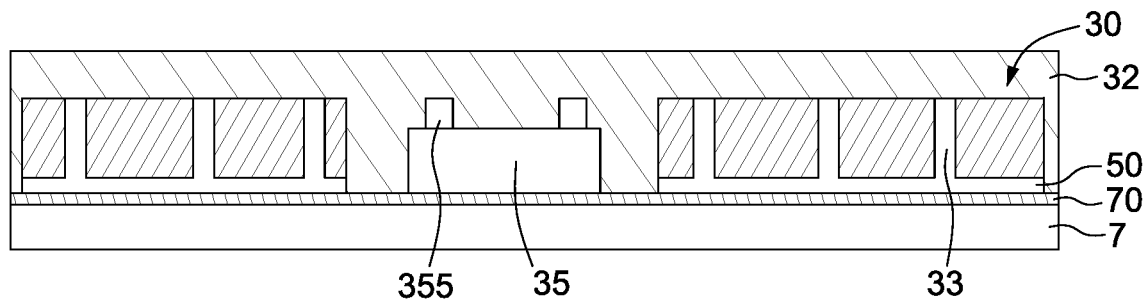

As shown in FIG. 9B, an encapsulant 32 is applied on the conductive layer 70 of the carrier 7, the electrical connection members 30 and the chip 35. The encapsulant 32 encapsulates the electrical connection members 30 and the chip 35.

Figure 9C:
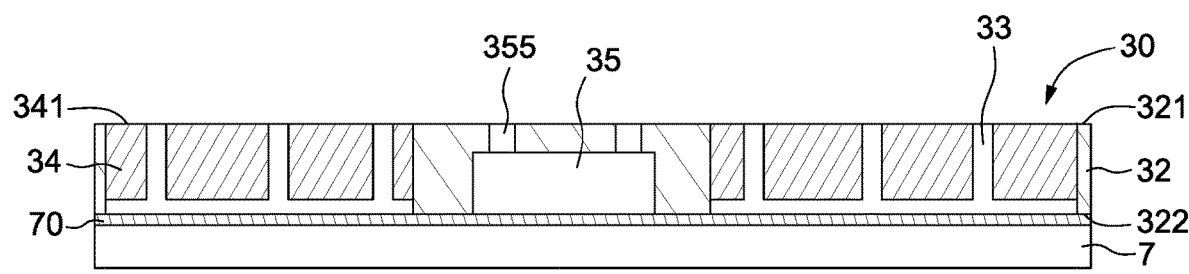

As shown in FIG. 9C, a portion of the encapsulant 32 is removed, for example, by grinding, such that the reinforcing layer 34 of the electrical connection member 30 has a surface 341 and the encapsulant 32 has a surface 321, and the surface 341 is substantially coplanar with the surface 321. Moreover, the conductive pillars 33 are exposed from the surface 341 of the reinforcing layer 34 and the electrical contacts 355 of the chip 35 are exposed from the surface 321 of the encapsulant 32.

Figure 9D:
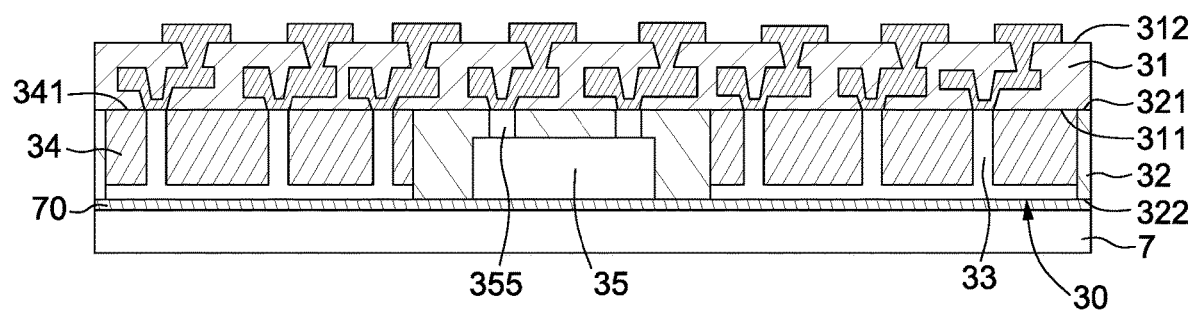

As shown in FIG. 9D, a redistribution layer 31 is disposed on the electrical connection members 30 and encapsulant 32 and electrically connected to the conductive pillars 33 and the electrical contacts 355 of the chip 35. The redistribution layer 31 has a surface 311 attached to the surface 341 of the reinforcing layer 34 of the electrical connection member 30 and the surface 321 of the encapsulant 32.

Figure 9E:
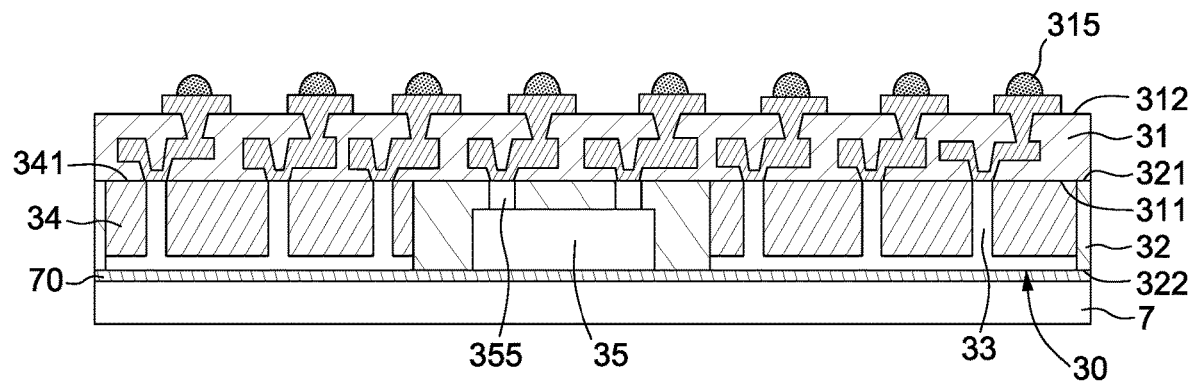

As shown in FIG. 9E, a plurality of solder balls 315 are mounted on a surface 312 of the redistribution layer 31 opposite to the surface 311.

Figure 9F:
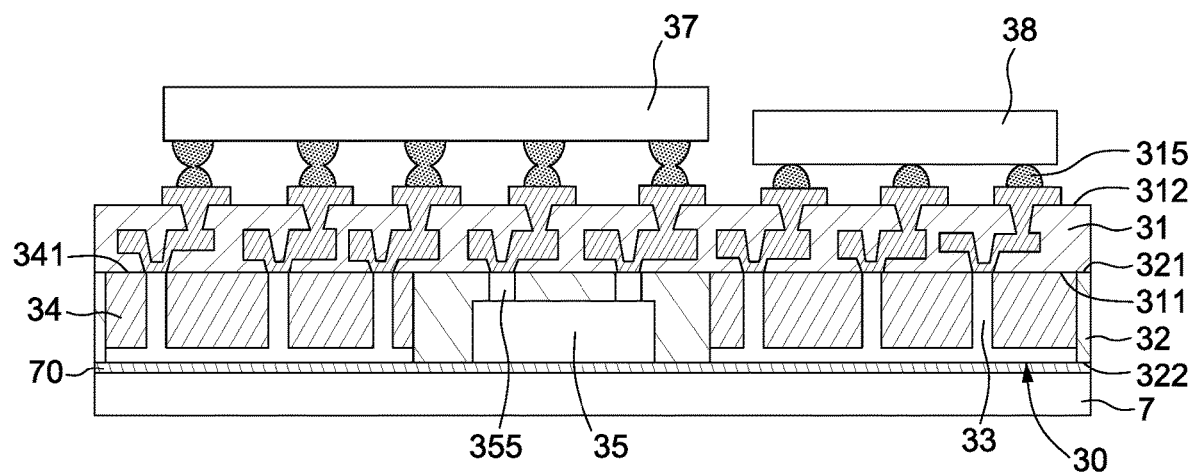

As shown in FIG. 9F, electronic components 37 and 38 are mounted on the surface 312 of the redistribution layer 31 and electrically connected to the solder balls 315.

Figure 9G:
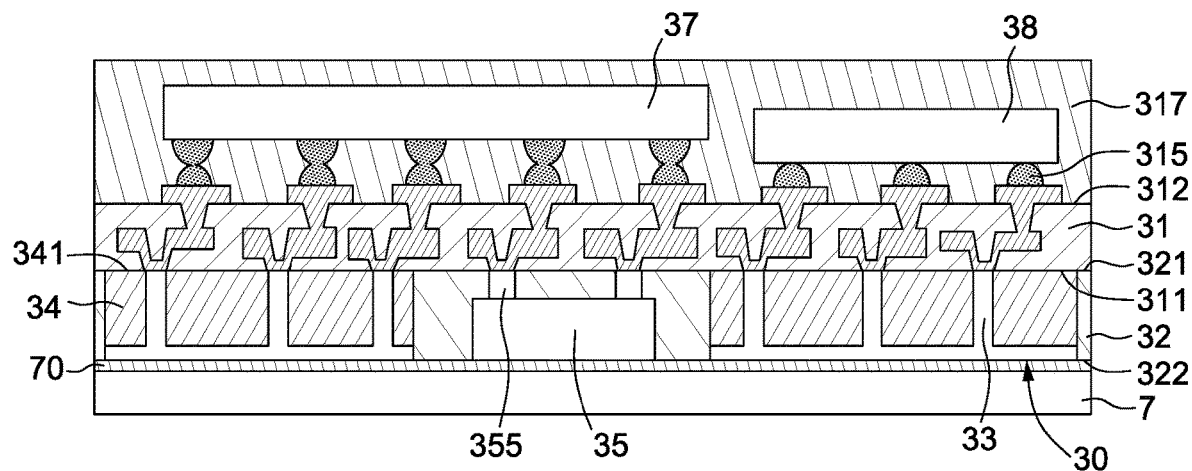

As shown in FIG. 9G, a tape 317 is applied on the surface 312 of the redistribution layer 31 and covers the electronic components 37 and 38 and the solder balls 315.

Figure 9H:
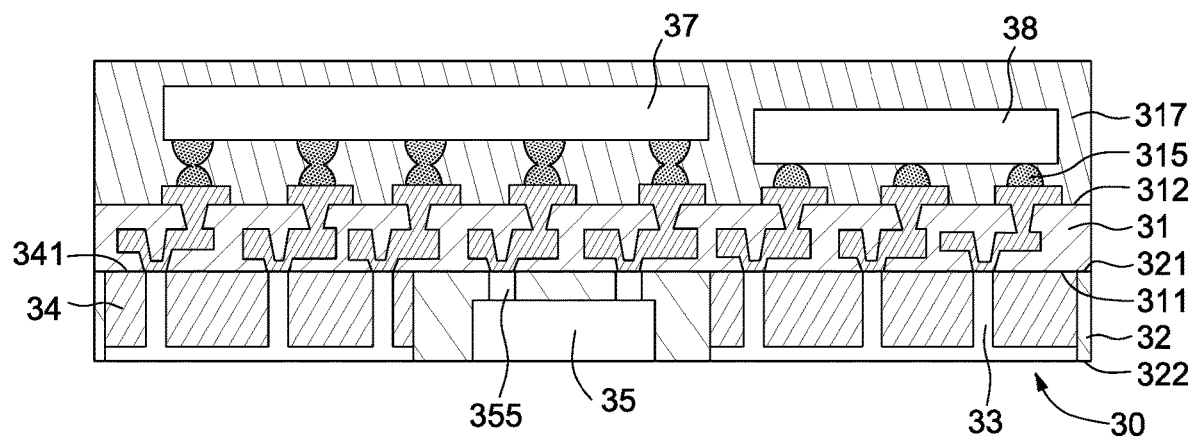

As shown in FIG. 9H, the carrier 7 and the conductive layer 70 of the carrier 7 are removed.

Figure 9I:
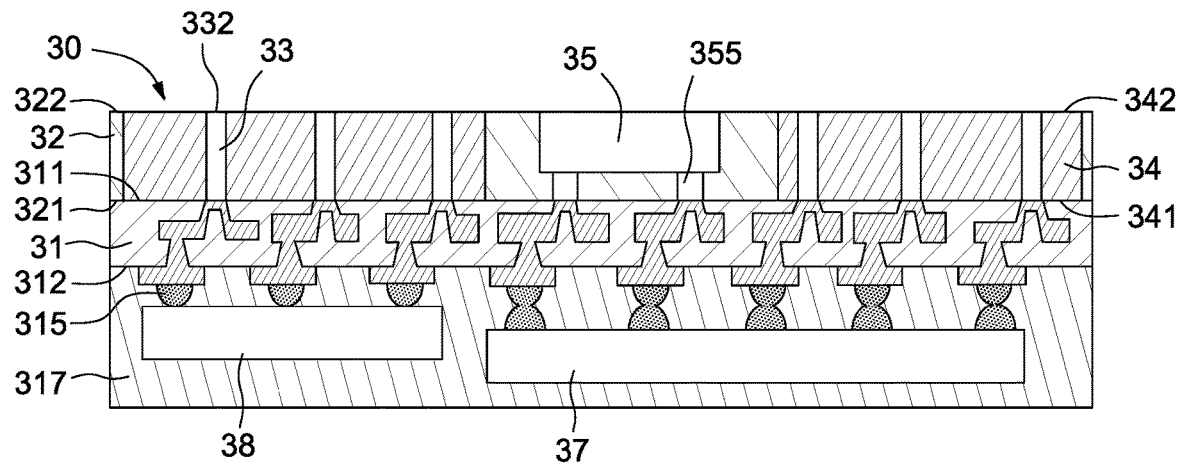

As shown in FIG. 9I, the conductive layer 50 is removed, e.g., by grinding. After grinding the conductive layer 50, the electrical connection member 30 has a substantially flat surface (e.g., the surface 342 of the reinforcing layer 34 and the surface 332 of the conductive pillars 33 are flat and coplanar), the encapsulant 32 has a substantially flat surface 322. The surface 342 and the surface 332 are substantially coplanar with the surface 322. In addition, the back surface of the chip 35 is substantially coplanar with the surface 342 of the reinforcing layer 34.

Figure 9J:
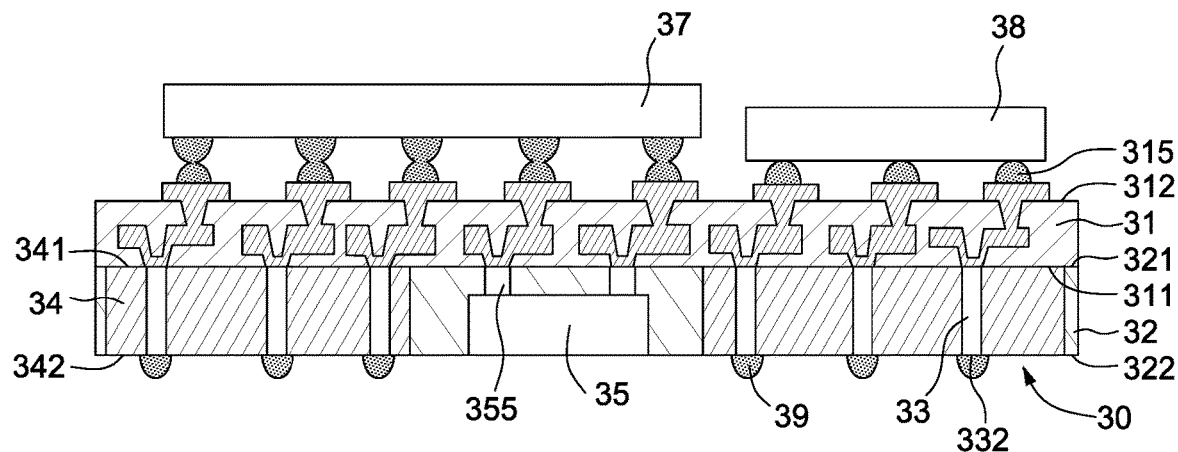

As shown in FIG. 9J, the tape 317 is removed. Further, a plurality of the solder balls 39 are mounted and electrically connected to the surface 332 of the conductive pillars 33.

FIGS. 10A, 10B, 10C, 10D, 10E, 10F, 10G, 10H, 10I and 10J illustrate one or more stages of a method of manufacturing a semiconductor package in accordance with some embodiments of the present disclosure.

Figure 10A:
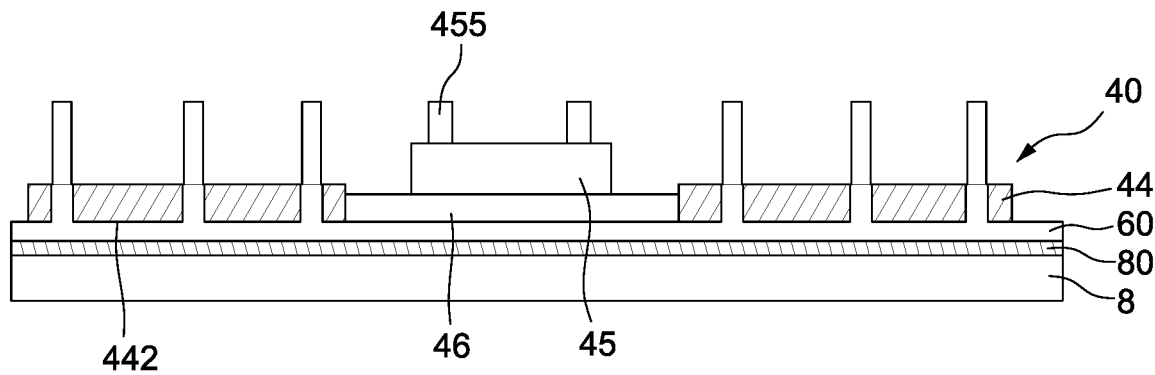
FIG. 10A, FIG. 10B, FIG. 10C, FIG. 10D, FIG. 10E, FIG. 10F, FIG. 10G, FIG. 10H, FIG. 10I and FIG. 10J illustrate one or more stages of a method of manufacturing a semiconductor device package in accordance with some embodiments of the present disclosure.

As shown in FIG. 10A, a carrier 8 having a conductive layer 80 on a top surface of the carrier is provided. The electrical connection member 40 prepared in accordance with the method illustrated in FIGS. 8A, 8B, 8C, 8D, 8E, 8F, 8G, 8H, 8I and 8J is arranged on the conductive layer 80 of the carrier 8. A chip 45 is arranged on the conductive layer 46 of the electrical connection member 40. The conductive layer 60 integrated with the electrical connection members 40 are attached to the conductive layer 80 of the carrier 8. The chip 45 has an active surface and a back surface opposite to the active surface. An electrical contact 455 is disposed on the active surface of the chip 45. The back surface of the chip 45 is attached on the conductive layer 80 of the carrier 8.

Figure 10B:
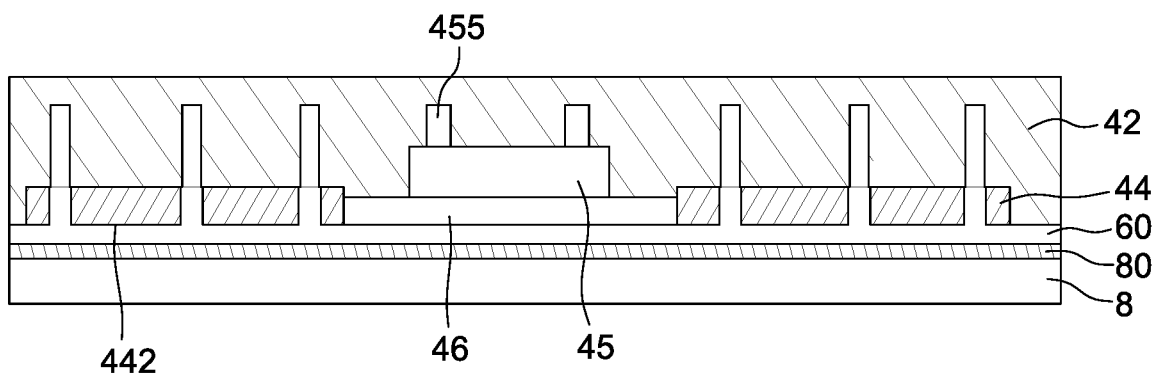

As shown in FIG. 10B, an encapsulant 42 is applied on the conductive layer 80 of the carrier 8, the electrical connection member 40 and the chip 45. Thus, the encapsulant 42 encapsulates the carrier 8, the electrical connection members 40 and the chip 45.

Figure 10C:
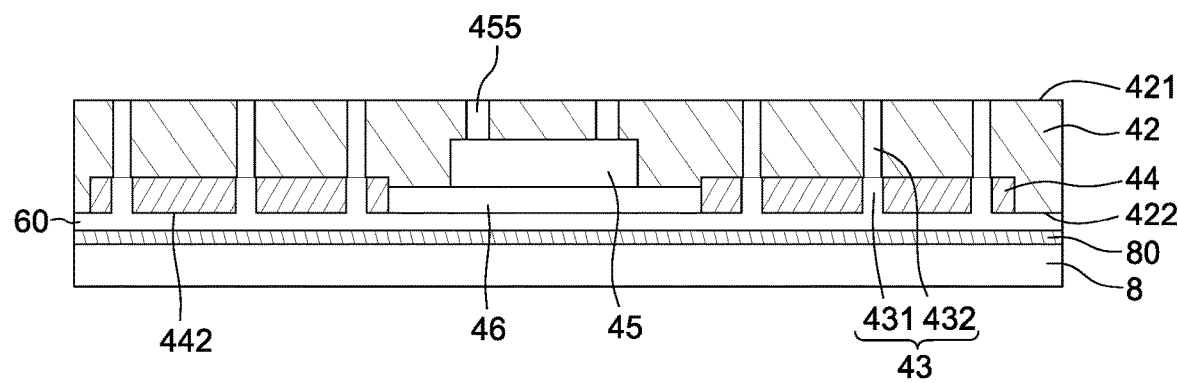

As shown in FIG. 10C, a portion of the encapsulant 42 is removed, for example, by grinding, such that the encapsulant 42 has a surface 421. Moreover, the second pillar portions 432 of the conductive pillars 43 and the electrical contacts 455 of the chip 45 are exposed from the surface 421 of the encapsulant 42.

Figure 10D:
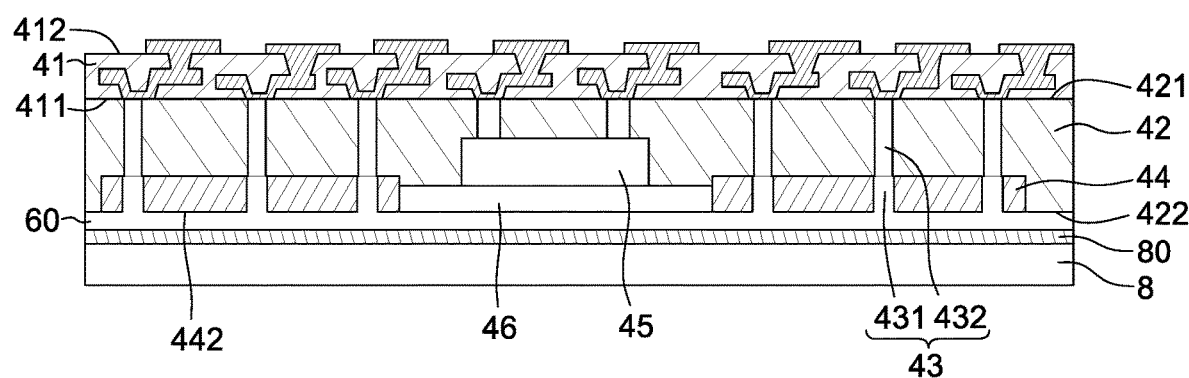

As shown in FIG. 10D, a redistribution layer 41 is disposed on the electrical connection member 40 and encapsulant 42 and electrically connected to the second pillar portions 432 of the conductive pillars 43 and the connections 455 of the chip 45. The redistribution layer 41 has a surface 411 attached to the surface 421 of the encapsulant 42.

Figure 10E:
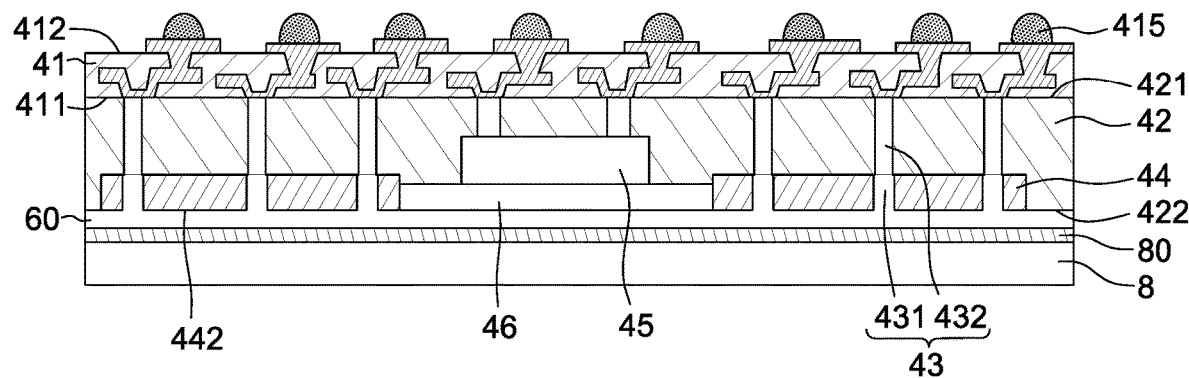

As shown in FIG. 10E, a plurality of solder balls 415 are mounted on a surface 412 of the redistribution layer 41 The surface 412 is opposite to the surface 411.

Figure 10F:
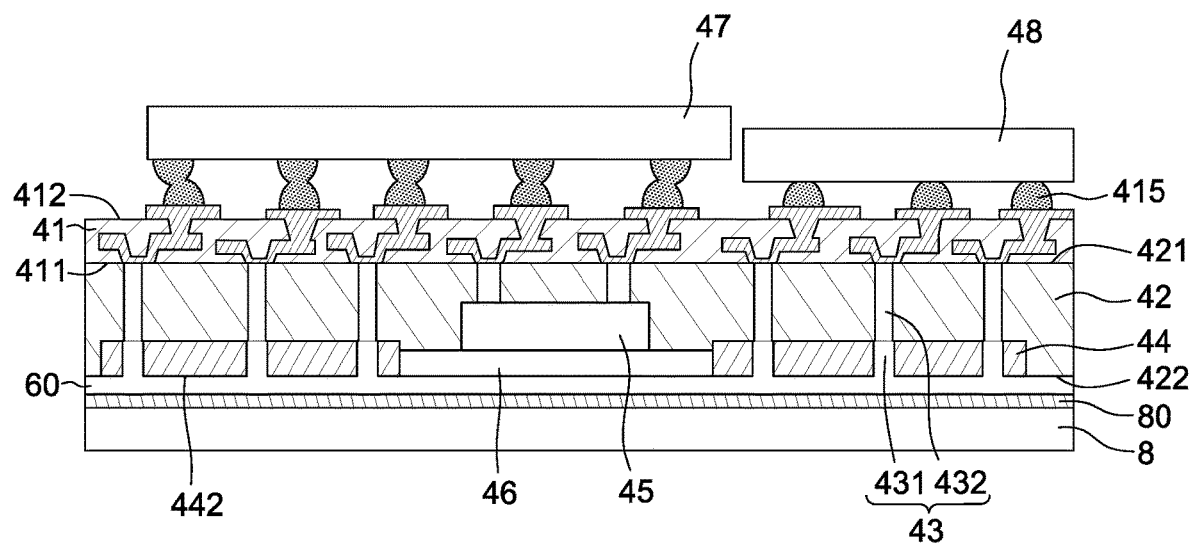

As shown in FIG. 10F, electronic components 47 and 48 are mounted on the surface 412 of the redistribution layer 41 and electrically connected to the solder balls 415.

Figure 10G:
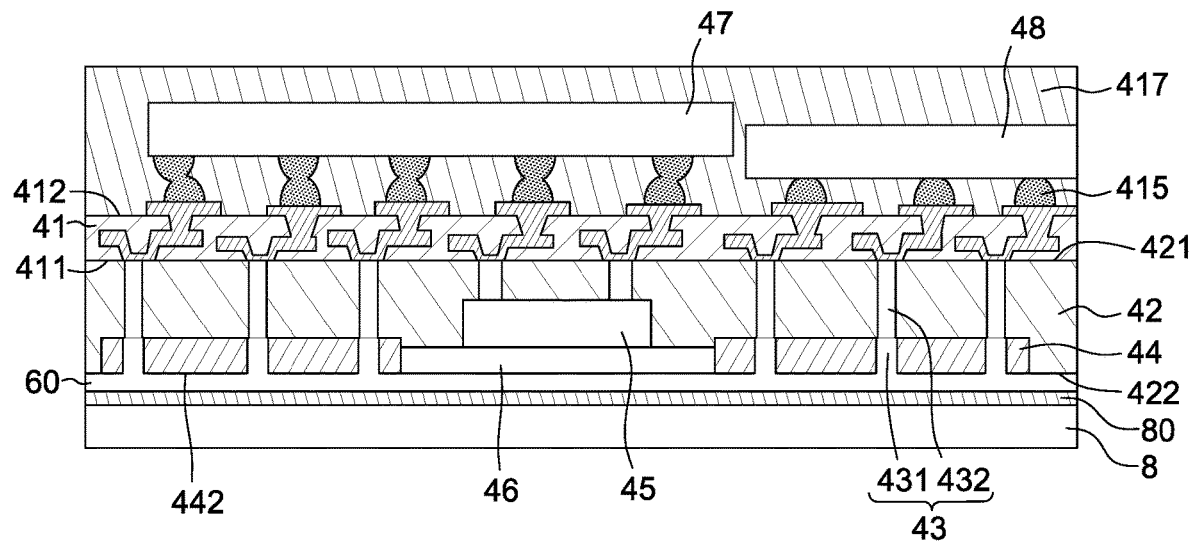

As shown in FIG. 10G, a tap 417 is applied on the surface 412 of the redistribution layer 41 and covers the electronic components 47 and 48 and the solder balls 415.

Figure 10H:
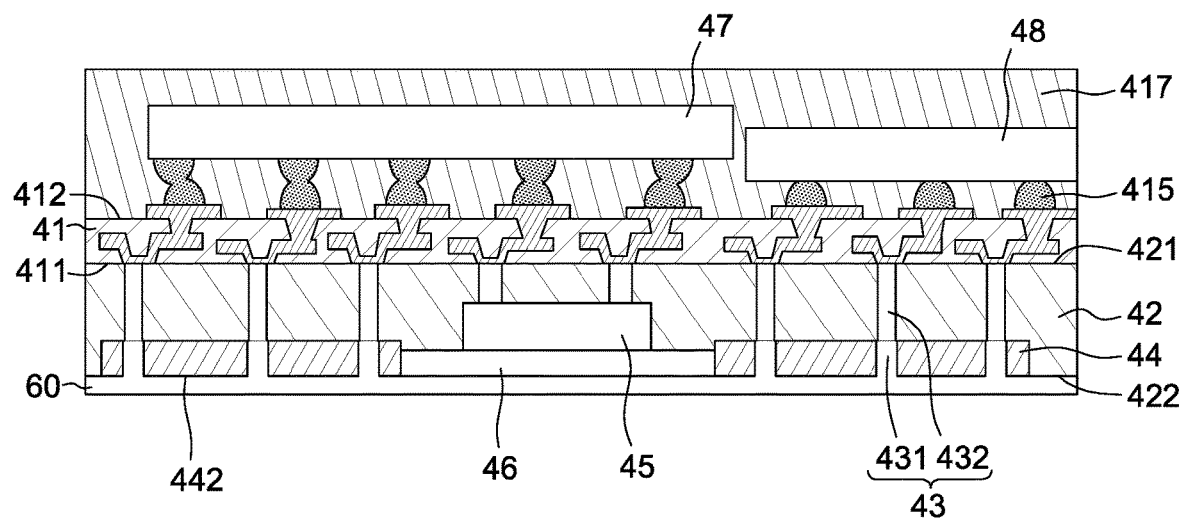

As shown in FIG. 10H, the carrier 8 and the conductive layer 80 of the carrier 8 are removed.

Figure 10I:
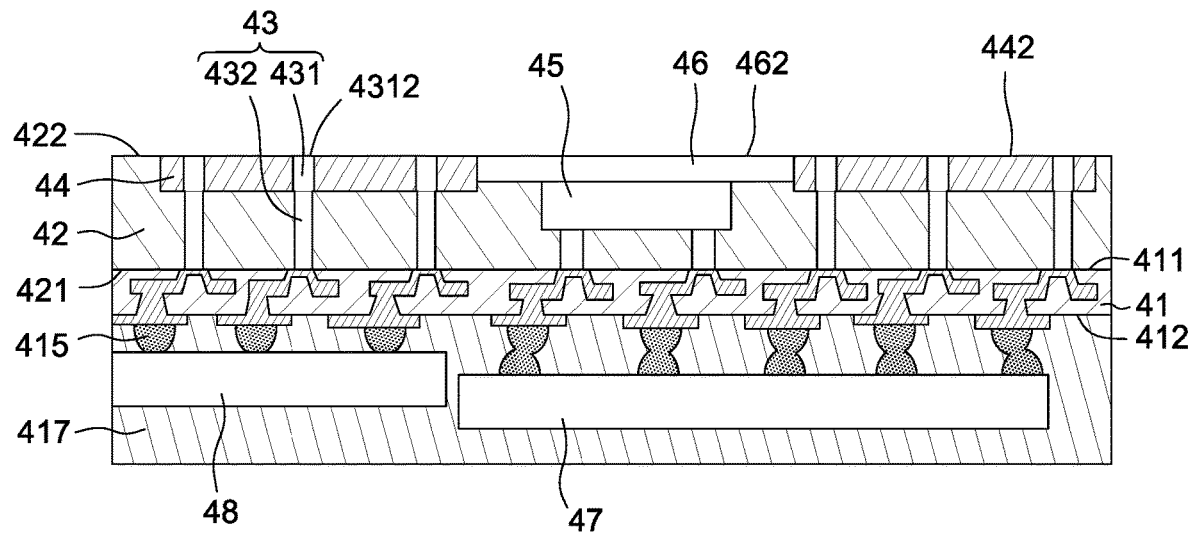

As shown in FIG. 10I, the conductive layer 60 is removed e.g., by grinding. After grinding the conductive layer 60, the electrical connection member 40 has a substantially flat surface (e.g., the surface 442 of the reinforcing layer 44 and the surface 4312 of the conductive pillars 43 are flat and coplanar) and the encapsulant 42 has a substantially flat surface 422. The surface 442 is substantially coplanar with the surface 422. In addition, the conductive layer 46 may have a surface 462 which is substantially coplanar with the surface 442 of the reinforcing layer 42.

Figure 10J:
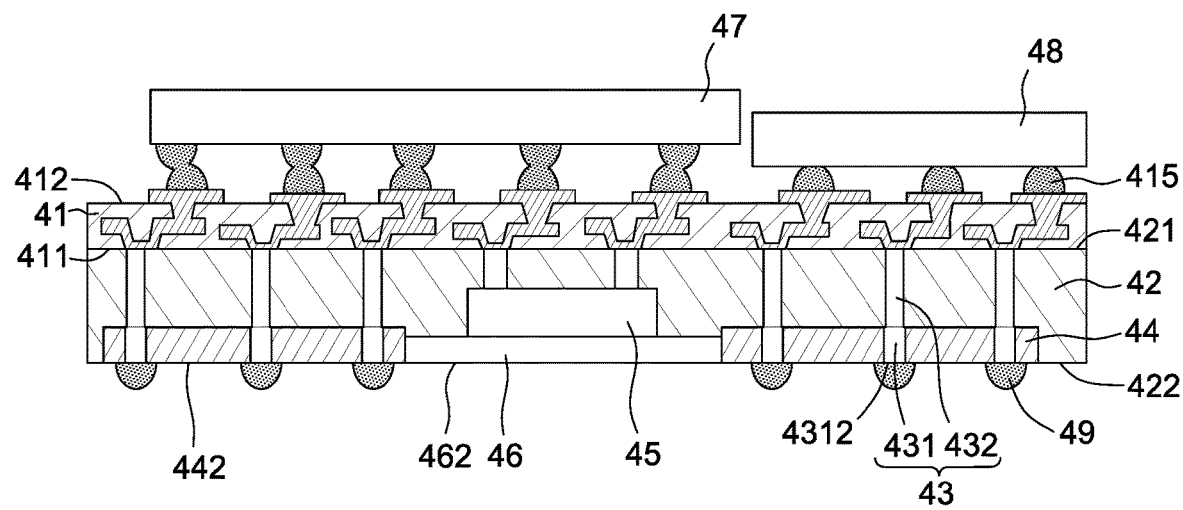

As shown in FIG. 10J, the tape 417 is removed. Further, a plurality of the solder balls 49 are mounted and electrically connected to the first pillar portions 431 of the conductive pillars 43.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to +/−10% of that numerical value, such as less than or equal to +/−5%, less than or equal to +/−4%, less than or equal to +/−3%, less than or equal to +/−2%, less than or equal to +/−1%, less than or equal to +/−0.5%, less than or equal to +/−0.1%, or less than or equal to +/−0.05%. For example, two numerical values can be deemed to be "substantially" the same or equal if a difference between the values is less than or equal to +/−10% of an average of the values, such as less than or equal to +/−5%, less than or equal to +/−4%, less than or equal to +/−3%, less than or equal to +/−2%, less than or equal to +/−1%, less than or equal to +/−0.5%, less than or equal to +/−0.1%, or less than or equal to +/−0.05%.

Two surfaces can be deemed to be coplanar or substantially coplanar if a displacement between the two surfaces is no greater than 5 μm, no greater than 2 μm, no greater than 1 μm, or no greater than 0.5 μm.

A surface can be deemed to be planar or substantially planar if a difference between a highest point and a lowest point on the surface is no greater than 5 μm, no greater than 2 μm, no greater than 1 μm, or no greater than 0.5 μm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package, comprising:
    an electrical connection member comprising a reinforcing layer and a plurality of conductive pillars passing through the reinforcing layer;
    a first electronic component;
    an encapsulant encapsulating the first electronic component and the electrical connection member; and
    a first redistribution layer disposed on a top surface of the encapsulant and electrically connected to at least one of the conductive pillars;
    wherein a bottom surface of the conductive pillars is coplanar with a bottom surface of the reinforcing layer and a bottom surface of the encapsulant;
    wherein the reinforcing layer has a first lateral surface facing the first electronic component and the encapsulant extends between the first electronic component and the first lateral surface of the reinforcing layer;
    wherein the reinforcing layer has an upper surface facing the first redistribution layer and spaced apart from the first redistribution layer, and wherein the conductive pillars protrudes from the upper surface of the reinforcing layer;
    wherein the encapsulant encapsulates the upper surface of the reinforcing layer and a second lateral surface of the reinforcing layer, and wherein the second lateral surface of the reinforcing layer is opposite to the first lateral surface of the reinforcing layer;
    wherein the encapsulant extends between the conductive pillars;
    wherein the first electronic component has an active surface facing the first redistribution layer and a side surface connected to the active surface, and wherein the encapsulant encapsulates the side surface and the active surface of the first electronic component.

2. The semiconductor device package of claim 1, wherein an elevation of the active surface of the first electronic component is higher than an elevation of the upper surface of the reinforcing layer.

3. The semiconductor device package of claim 2, wherein the reinforcing layer has a bottom surface opposite to the upper surface of the reinforcing layer and the first electronic component has a backside surface opposite to the active surface, and wherein an elevation of the backside surface of the first electronic component is between the elevation of the upper surface of the reinforcing layer and an elevation of the bottom surface of the reinforcing layer.

4. The semiconductor device package of claim 1, wherein each of the conductive pillars has a first pillar portion and a second pillar portion, and wherein the second pillar portion is disposed on a bottom surface of the first redistribution layer and a lateral surface of the second pillar portion is covered by the encapsulant, and wherein the first pillar portion is in direct contact with the second pillar portion and a lateral surface of the first pillar portion is covered by the reinforcing layer, and wherein the first pillar portion has a bottom surface adjacent to the bottom surface of the reinforcing layer and the second pillar portion has an upper surface adjacent to the bottom surface of the first redistribution layer, and wherein a diameter of the bottom surface of the first pillar portion is greater than a diameter of the upper surface of the second pillar portion.

5. A semiconductor device package, comprising:
    an electrical connection member comprising a reinforcing layer and a plurality of conductive pillars passing through the reinforcing layer;
    a first electronic component;
    an encapsulant encapsulating the first electronic component and the electrical connection member; and
    a first redistribution layer disposed on a top surface of the encapsulant and electrically connected to at least one of the conductive pillars;
    wherein a bottom surface of the conductive pillars is coplanar with a bottom surface of the reinforcing layer and a bottom surface of the encapsulant;
    wherein the reinforcing layer has a first lateral surface facing the first electronic component and the encapsulant extends between the first electronic component and the first lateral surface of the reinforcing layer;
    wherein each of the conductive pillars has a first pillar portion and a second pillar portion, and wherein the second pillar portion is disposed on a bottom surface of the first redistribution layer and a lateral surface of the second pillar portion is covered by the encapsulant, and wherein the first pillar portion is in direct contact with the second pillar portion and a lateral surface of the first pillar portion is covered by the reinforcing layer, and wherein a height of the second pillar portion is greater than a height of the first pillar portion.

6. A semiconductor device package, comprising:
    an electrical connection member comprising a reinforcing layer and a plurality of conductive pillars passing through the reinforcing layer;

a first electronic component;

an encapsulant encapsulating the first electronic component and the electrical connection member; and a first redistribution layer disposed on a top surface of the encapsulant and electrically connected to at least one of the conductive pillars;

wherein a bottom surface of the conductive pillars is coplanar with a bottom surface of the reinforcing layer and a bottom surface of the encapsulant;

wherein the reinforcing layer has a first lateral surface facing the first electronic component and the encapsulant extends between the first electronic component and the first lateral surface of the reinforcing layer;

wherein the first electronic component has a side surface connected to the active surface, and wherein the encapsulant encapsulates the side surface and the active surface of the first electronic component, and wherein the reinforcing layer has a third surface facing the first redistribution layer, and wherein an elevation of the active surface of the first electronic component is higher than an elevation of the third surface of the reinforcing layer, and wherein each of the conductive pillars has a first pillar portion and a second pillar portion, and wherein the second pillar portion is disposed on a bottom surface of the first redistribution layer and a lateral surface of the second pillar portion is covered by the encapsulant, and wherein the first pillar portion is in direct contact with the second pillar portion and a lateral surface of the first pillar portion is covered by the reinforcing layer, and wherein the first pillar portion has a bottom surface adjacent to the bottom surface of the reinforcing layer and the second pillar portion has an upper surface adjacent to the bottom surface of the first redistribution layer, and wherein a diameter of the bottom surface of the first pillar portion is greater than a diameter of the upper surface of the second pillar portion, and wherein a height of the second pillar portion is greater than a height of the first pillar portion.

* * * * *